(12) United States Patent
Wong

(10) Patent No.: US 9,608,029 B2
(45) Date of Patent: Mar. 28, 2017

(54) OPTICAL PACKAGE WITH RECESS IN TRANSPARENT COVER

(71) Applicant: STMicroelectronics Pte Ltd., Singapore (SG)

(72) Inventor: Wing Shenq Wong, Singapore (SG)

(73) Assignee: STMICROELECTRONICS PTE LTD., Singapore (SG)

( * ) Notice: Subject to any disclaimer, the term of this patent is extended or adjusted under 35 U.S.C. 154(b) by 308 days.

(21) Appl. No.: 13/931,313

(22) Filed: Jun. 28, 2013

(65) Prior Publication Data

US 2015/0001111 A1   Jan. 1, 2015

(51) Int. Cl.
| | | |
|---|---|---|
| H01L 27/14 | (2006.01) | |
| H01L 31/14 | (2006.01) | |
| H01L 21/00 | (2006.01) | |
| H01L 27/146 | (2006.01) | |

(52) U.S. Cl.
CPC .. *H01L 27/14683* (2013.01); *H01L 27/14618* (2013.01); *H01L 2224/48091* (2013.01); *H01L 2224/48465* (2013.01); *H01L 2224/73265* (2013.01); *H01L 2924/16235* (2013.01)

(58) Field of Classification Search
CPC ....... H01L 21/60; H01L 21/77; H01L 23/495; H01L 31/0203; H01L 21/00; H01L 27/14; H01L 27/14618; H01L 27/14683; H01L 31/14

See application file for complete search history.

(56) References Cited

U.S. PATENT DOCUMENTS

| | | | | |
|---|---|---|---|---|
| 6,407,381 B1* | 6/2002 | Glenn | ................... | H01L 24/94 250/208.1 |
| 6,455,927 B1* | 9/2002 | Glenn | ................... | B81B 7/0067 257/680 |
| 6,503,780 B1* | 1/2003 | Glenn | ............... | H01L 27/14618 438/106 |
| 2005/0059188 A1* | 3/2005 | Bolken | ................... | H01L 21/50 438/106 |
| 2005/0155704 A1* | 7/2005 | Yokajty | ............... | H01L 51/5237 156/295 |
| 2005/0169620 A1* | 8/2005 | Minamio | .......... | H01L 27/14618 396/71 |
| 2007/0004175 A1* | 1/2007 | Harris | ................... | B28D 5/0011 438/460 |
| 2007/0018309 A1* | 1/2007 | Chang | ................. | H01L 21/6836 257/704 |
| 2007/0026553 A1* | 2/2007 | Buckley | .................. | H01L 51/56 438/28 |
| 2007/0108578 A1* | 5/2007 | Watanabe | ......... | H01L 27/14627 257/680 |
| 2007/0166867 A1* | 7/2007 | Chow | ............... | H01L 27/14618 438/65 |
| 2007/0222875 A1* | 9/2007 | Moriya | ................... | H01L 24/97 348/294 |

(Continued)

*Primary Examiner* — Fazli Erdem
(74) *Attorney, Agent, or Firm* — Seed IP Law Group LLP

(57) ABSTRACT

Embodiments of the present invention are directed to optical packages having a cover made of transparent material with a recess formed therein and methods of forming same. The recess may be formed in a periphery portion of the transparent material and may have various shapes and configurations. Adhesive is provided in at least a portion of the recess of the transparent material, which secures the transparent material to an image sensor.

25 Claims, 6 Drawing Sheets

(56) References Cited

U.S. PATENT DOCUMENTS

| | | | |
|---|---|---|---|
| 2008/0012084 A1* | 1/2008 | Kwon | H01L 27/14618 257/432 |
| 2008/0224291 A1* | 9/2008 | Schwab | H01L 23/16 257/678 |
| 2009/0026593 A1* | 1/2009 | Kwang | 257/676 |
| 2010/0013041 A1* | 1/2010 | Bolt | 257/443 |
| 2010/0176476 A1* | 7/2010 | Takayama | B26D 1/0006 257/432 |
| 2013/0128092 A1* | 5/2013 | Ogasahara et al. | 348/335 |
| 2014/0021491 A1* | 1/2014 | Meng | H01L 33/54 257/82 |
| 2014/0175389 A1* | 6/2014 | Xiong et al. | 257/40 |
| 2015/0062248 A1* | 3/2015 | Lamers | B41J 2/14024 347/44 |

* cited by examiner

OPTICAL PACKAGE WITH RECESS IN TRANSPARENT COVER

BACKGROUND

Technical Field

Embodiments of the present disclosure are directed to packages that include an image sensor and methods of forming same.

Description of the Related Art

Optical packages include one or more image sensors or images sensors, such as photodiodes, located within a package body. The image sensor has a pixel array formed on its upper surface that receives radiation. The package body typically includes a cover of transparent material, such as glass, that is located over the upper surface of the image sensor and is configured to protect the pixel array while still allowing radiation to be provided therethrough. In some packages, the transparent material is secured to the upper surface of the image sensor.

BRIEF SUMMARY

Embodiments of the present invention are directed to optical packages having a cover made of transparent material with one or more recesses formed therein and methods of forming same. The recess may be formed in a periphery portion of the transparent material and may have various shapes and configurations. Adhesive is provided in at least a portion of the recess of the transparent material and secures the transparent material to an upper surface of an image sensor.

In one embodiment there is provided an optical package comprising an image sensor having an upper surface. The upper surface of the image sensor includes a pixel array formed therein. The optical package further includes a transparent material located over the pixel array. The transparent material has a first surface and an opposite, second surface. The first surface has a recess located at a periphery portion of the transparent material. The optical package further includes an adhesive securing the transparent material to the upper surface of the image sensor, and at least a portion of the adhesive is located in the recess of the transparent material.

DETAILED DESCRIPTION

As discussed above, optical packages include a cover made of transparent material secured to an upper surface of an image sensor. Existing solutions for securing the transparent material to the upper surface of the image sensor includes using adhesive material and one or more spacers at a periphery of the transparent material. The spacers are dispensed within the adhesive material and have a diameter of about 5 microns.

The inventors discovered that when the transparent material is placed over the adhesive material and image sensor, the adhesive flows between the transparent material and the image sensor. Some of the adhesive may even flow over the pixel array of the image sensor thereby affecting the integrity of the image sensor.

Figure 1:
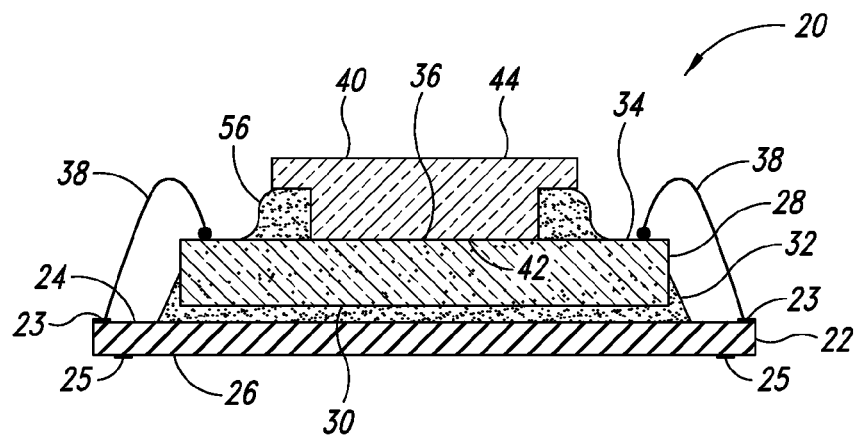
FIG. 1 is a cross-sectional view of a partially assembled optical package in accordance with an embodiment of the invention.

FIG. 1 shows a cross-sectional view of a partial optical package 20, in accordance with one embodiment of the invention. The optical package 20 includes a substrate 22 having an inner surface 24 and an outer surface 26. The optical package 20 further includes an optical sensor or an image sensor 28 having a lower surface 30 secured to the inner surface 24 of the substrate 22 by an adhesive material 32. The adhesive material 32 may be tape, paste, glue or other adhesive material. In some embodiments the adhesive material 32 is curable, such as ultraviolet (UV) curable.

An upper surface 34 of the image sensor 28 has a pixel array 36 formed thereon. The image sensor 28 may be any optical device configured to receive radiation, such as infrared (IR), and convert the received radiation into electrical signals. The image sensor 28 may be formed in a semiconductor material, such as silicon. The top most layer of the image sensor 28 will typically be a passivation layer of transparent material, such as silicon carbide $SiO_2$ or the like. Under this transparent layer will be light sensitive circuit elements, such as CCD array, photodiodes, photo transistors, or the like Generally described, the substrate 22 may include one or more conductive and insulative layers and includes first pads 23 on its inner surface 24 and second pads 25 on its outer surface 26. The first pads of the substrate 22 are electrically coupled to pads on the image sensor by conductive wires 38. Although not shown, it is to be appreciated that the pads of the image sensor 28 may be electrically coupled to the first pads of the substrate 22 via a ball grid array or other techniques that are well known in the art. The substrate 22 may include an integrated circuit configured to process the electrical signals received from the image sensor 28. It is to be appreciated that the substrate 22 can function as a base for the optical package 20, with the outer surface 26 being the outer surface of the package. Alternatively, the optical package 20 can be part of a package on package (PoP)

assembly and thus the outer surface 26 of the substrate 22 may be coupled to another package located therebelow.

A transparent material 40 is located over the image sensor 28 and acts as a cover for the optical package 20. The transparent material 40 protects the image sensor 28, while at the same time allows radiation to pass through to the image sensor 28. The transparent material 40 is any material that allows a desired radiation to pass therethrough. In one embodiment, the transparent material 40 is glass.

Figure 2A:
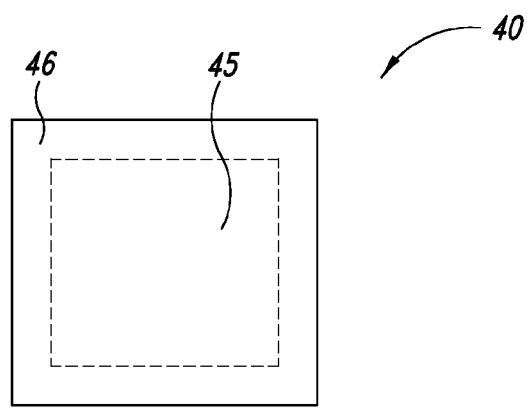
FIGS. 2A and 2B illustrate steps of forming the optical package of FIG. 1 in accordance with an embodiment of the invention.

The transparent material 40 includes a first surface 42 and a second surface 44. In the illustrated embodiment, the first surface 42 of the transparent material 40 is facing the upper surface 34 of the image sensor 28. The first surface 42 of the transparent material 40 has a center portion 45 and a periphery portion 46 as best shown in FIG. 2A. A recess 48 is located on the first surface 42 of the transparent material 40 at the periphery portion 46. As illustrated, the recess 48 forms a recessed bottom surface 50 and a recessed side surface 52 of the transparent material 40. In the illustrated embodiment, the recess 48 is shown in cross section as rectangular shaped; however, the cross-sectional shape of the recess may be any shape, such as square, concave, circular, or any other shape forming a recess.

The transparent material 40 is secured to the upper surface 34 of the image sensor 28 by an adhesive material 56. The adhesive material 56 is a flowable material prior to hardening. In particular, the adhesive material 56 is suitably flexible or flowable to move within the recess 48 of the transparent material 40 as the transparent material 40 is applied to the upper surface 34 of the image sensor 28. In some embodiments, the adhesive material 32 is glue or paste. In one embodiment, the adhesive material 32 is a UV curable glue or paste. The adhesive material 56 may be the same material or a different material from the adhesive material 32.

FIG. 2A shows a plan view of the first surface 42 of the transparent material 40. As shown, the periphery portion 46 includes the recess 48 such that the recess 48 extends to an outer edge of the transparent material 40 and is located around the entire outer edge of the transparent material 40. It is to be appreciated that in other embodiments, the recess 48 may be located at portions along the outer edge, such as along one side or portions of one side of the outer edge of the transparent material 40.

In one embodiment, the recess 48 is formed by saw cutting to a depth that is less than the thickness of the transparent material 40. It is to be appreciated that in many embodiments, the recess 48 is formed in the transparent material at wafer level and the wafer level transparent material is then singulated to form transparent material 40 as shown in FIG. 2A. For instance, the wafer level transparent material may be first sawn to a depth less than the thickness of the transparent material in a first orientation and then in a second, perpendicular orientation using a first saw blade. The first saw blade has a thickness that is greater than the width of two adjoining recesses on the wafer level transparent material. A second saw blade is then used to singulate the transparent material and cuts through a center portion of the adjoining recess formed by the first saw blade. The second saw blade is substantially thinner than the first saw blade. It is to be appreciated, however, that the recess and singulating may formed by other methods, such as by laser or etching.

Figure 2B:
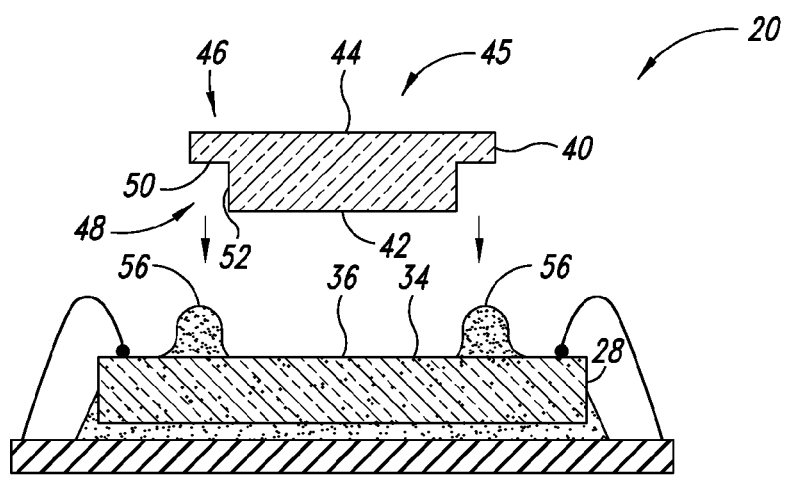

FIG. 2B illustrates a final stage of forming the optical package 20 of FIG. 1. In general, after the image sensor 28 has been secured to the substrate 22 by the adhesive material 32 and electrically coupled to the substrate 22 by the conductive wires 38, the adhesive material 56 is deposited on the upper surface 34 of the image sensor 28. The adhesive may be deposited on the upper surface 34 in a closed shape that substantially corresponds to the shape of the recess 48 of the transparent material 40, such as a square or rectangular shape or may be deposited intermittently on the upper surface 34 of the image sensor 28.

The recess 48 of the transparent material 40 is then aligned with the adhesive material 56 and is placed onto the upper surface 34 of the image sensor 28 with the first surface 42 of the transparent material 40 facing the upper surface. It is to be appreciated that in another embodiment the adhesive material 56 may be deposited in the recess 48 of the transparent material 40 either prior to or after placing the transparent material 40 onto the upper surface 34 of the image sensor 28.

As indicated above, the adhesive material 56 is somewhat flowable and moves along the recessed bottom surface 50 and the recessed side surface 52 of the transparent material 40 as the center portion 45 of the first surface 42 of the transparent material 40 is placed over the upper surface 34 of the image sensor 28. The recessed side surface 52, however, inhibits the adhesive material 56 from flowing between the first surface 42 of the transparent material 40 and the upper surface 34 of the image sensor 28. In that regard, the recess 48 prevents or at least significantly reduces the flow of adhesive material 56 over the pixel array 36 of the image sensor 28. In one embodiment, the recess is sized to exceed the total volume of the adhesive material. This may ensure that the adhesive wets the surfaces of the recess.

Typically, the adhesive material 56 is not transparent and thus as the adhesive flows over the pixel array 36, the adhesive material 56 can block radiation intended for the pixel array 36, thereby harming the accuracy and integrity of the image sensor 28. Furthermore, even in a situation in which the adhesive material 56 is suitably transparent, the adhesive material 56 that flows over the pixel array 36 can cause the first and second surfaces 42, 44 of the transparent material 40 to become unparallel with the upper surface 34 of the image sensor 28. This lack of parallelism can affect the intensity of radiation being applied to the pixel array 36 such that varying portions of the pixel array receive different intensities.

After proper placement of the transparent material 40 is achieved, the adhesive material 56 hardens and in some embodiments may be cured, thereby securing the transparent material 40 to the image sensor 28.

Figure 3:
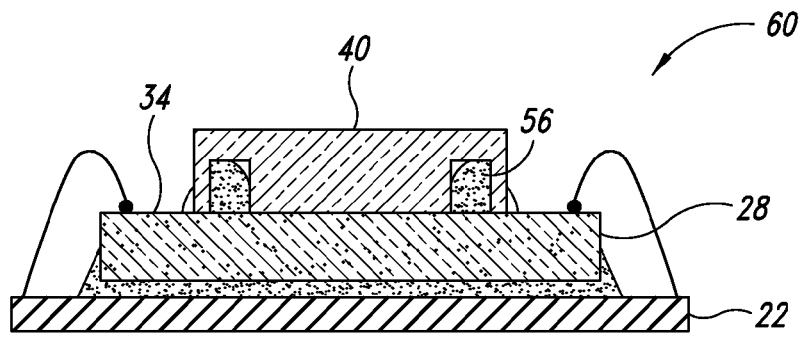
FIG. 3 is a cross-sectional view of another partially assembled optical package in accordance with an embodiment of the invention.
Figure 4A:
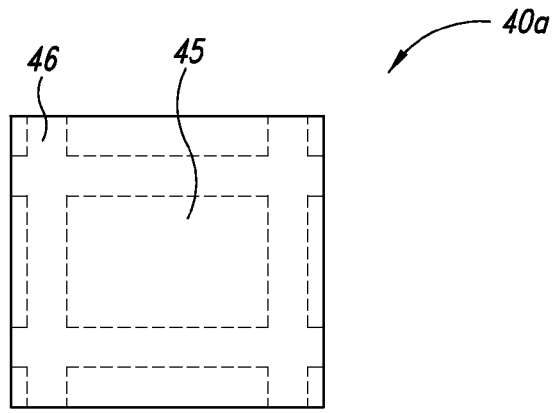
FIGS. 4A and 4B illustrate steps of forming the optical device of FIG. 3 in accordance with an embodiment of the invention.

FIG. 3 shows a cross-sectional view of a partial optical package 60, in accordance with another embodiment of the invention. The optical package 60 shown in FIG. 3 is substantially identical to the optical package 20 of FIG. 1 except that the transparent material 40 of optical package 60 has a recess 48a that forms a channel having a recessed bottom surface 50 that is separated by recessed side surfaces 52. Again, preferably the recess 48a is formed in the transparent material 40 at wafer level. As best shown in FIG. 4A, a laser or a saw blade may be used to cut the recess 40a. The wafer level transparent material is then singulated at a distance from the recess 40a.

Figure 4B:
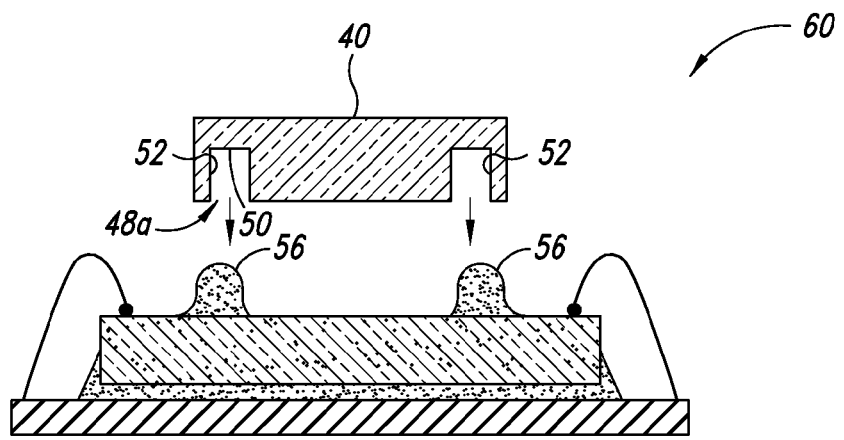

As shown in FIG. 4B, the transparent material 40 is placed onto the upper surface 34 of the image sensor 28 with the recess 48a aligned with the adhesive material 56. As discussed above, the adhesive material 56 is flowable and moves along the recessed bottom surface 50 and the recessed side surfaces 52 as the center portion 45 of the first surface 42 of the transparent material 40 is placed over the upper surface 34 of the image sensor 28. The recessed side surfaces 52, however, inhibit the adhesive material 56 from flowing between the first surface 42 of the transparent material 40 and the upper surface 34 of the image sensor 28.

In one embodiment, providing the recess 48a ensures that no adhesive will be located on the first surface 42 of the transparent material 40. This permits the first surface 42 to be in abutting contact with the top most surface of the image sensor 28. Additionally, the shear strength of adhesive material is substantially stronger than the tensile strength. In particular, when more adhesive material is along side surfaces, the adhesive strength increases versus when more adhesive is along the bottom surface of a recess. In that regard, by have more side surfaces, the recess 48a provides for improved adhesive strength by increasing the amount of surface area in which the adhesive material is in shear.

As shown in FIG. 3, the adhesive material 56 may be placed on the upper surface 34 of the image sensor 28 such that portions of the adhesive material 56 remain outwardly of the transparent material 40. That is, by placing the adhesive material 56 so that a portion of the adhesive material 56 may be outwardly of the recess 48a, some degree of offset is allowed when placing the transparent material 40a onto the upper surface 34 of the image sensor 28.

Figure 5A:
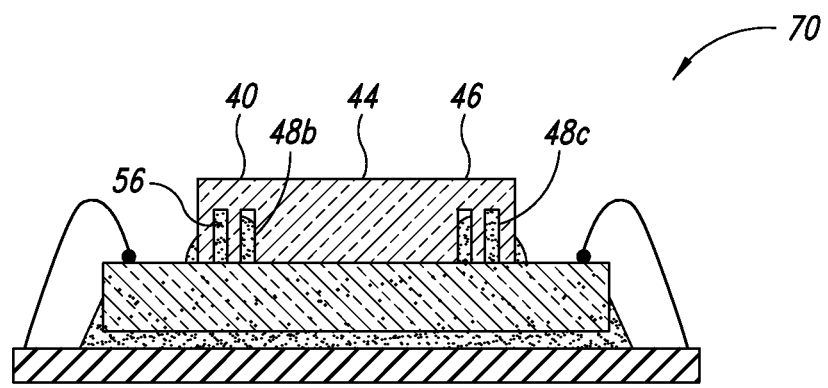
FIGS. 5A and 5B show cross-sectional views of other partially assembled optical packages in accordance with embodiments of the invention.
Figure 5B:
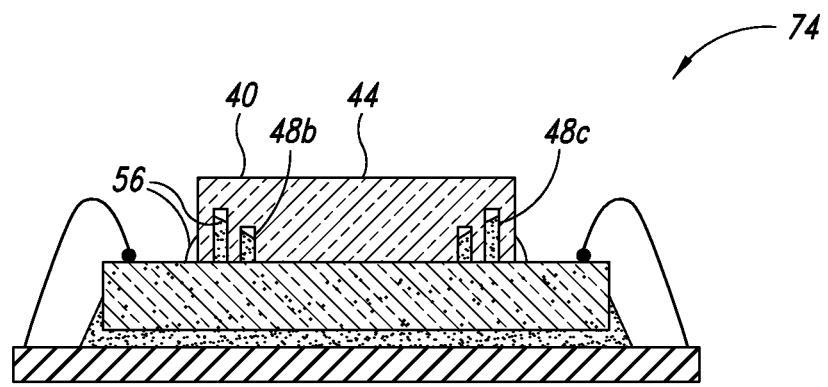

FIGS. 5A and 5B show cross-sectional views of partial optical packages 70, 74 in accordance with other embodiments of the invention. The optical package 70 shown in FIG. 5A is substantially identical to the optical package 60 of FIG. 3 except that the transparent material 40 of FIG. 5A includes inner recess 48b and outer recess 48c located in the periphery portion 46. The width of the recesses 48b, 48c in the optical package 70, however, may be smaller than the recess 48a in the optical package 60 of FIG. 3. Although only two recesses 48b, 48c are shown in FIG. 5A, it is to be appreciated that the transparent material 40 may include more than two recesses.

The inner and outer recesses 48b, 48c allow for some degree of offset when placing the transparent material 40 onto the upper surface 34 of the image sensor 28. For instance, the adhesive material 56 may be deposited onto the upper surface 34 of the image sensor 28 so that a center portion is aligned with the outer recess 48c. If any offset is present, the inner recess 48b may receive any overflow of the adhesive material 56 as is shown in FIG. 5B. In that regard, the inner recess 48b will likely have less adhesive material 56 than the outer recess 48c. Additionally, the inner recess 48b may be used to accept adhesive material 56 due to tolerance issues between the transparent material 40 and the image sensor 28. Furthermore, multiple recesses increase the surface area in which the adhesive may be in shear, thereby increasing the adhesive strength as discussed above.

The optical package 74 of FIG. 5B is substantially identical to the optical package 70 of FIG. 5A except that the transparent material 40 of FIG. 5B includes inner and outer of recesses 48b, 48c that have at least one different dimension than one another. As shown in FIG. 5B, the inner recess 48b has a shorter depth than the outer recess 48c. The inner recess 48b can provide structural integrity to the transparent material 40 due to its thicker cross section above the recess, while the outer recess 48c with deeper depths can receive more adhesive material 56.

Figure 6:
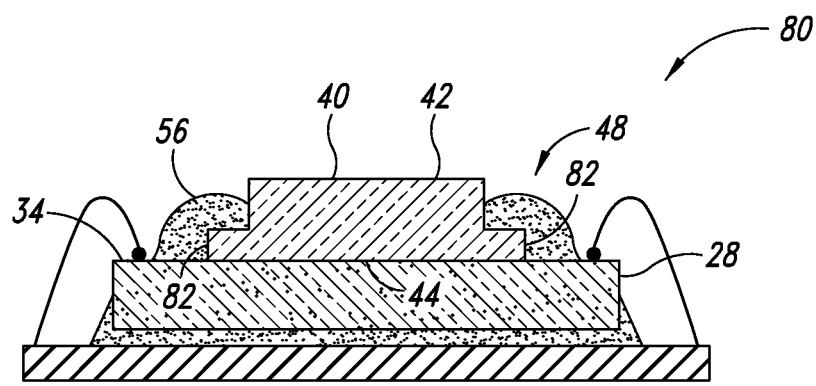
FIG. 6 is a cross-sectional view of another partially assembled optical package in accordance with an embodiment of the invention.

FIG. 6 shows a cross-sectional view of a partial optical package 80, in accordance with another embodiment of the invention. The optical package 80 shown in FIG. 6 is substantially identical to the optical package 20 of FIG. 1 except that in the optical package 80 the second surface 44 of the transparent material 40 is facing the upper surface 34 of the image sensor 28. In that regard, the recess 48 in the first surface 42 faces outwardly of the optical package 80. The adhesive material 56 is located in the recess 48, along outer side surfaces 82 of the transparent material 40, and on the upper surface 34 of the image sensor 28. In this embodiment, the transparent material 40 is placed onto the image sensor 28 and then the adhesive material 56 is deposited in the recess 48 and on the upper surface 34 of the image sensor 28.

Figure 7:
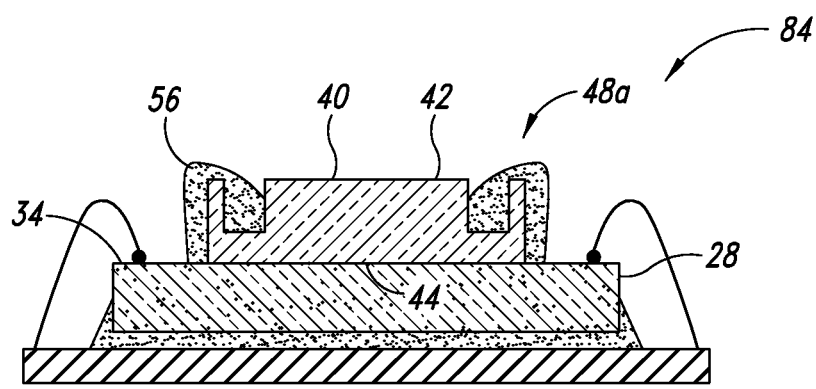
FIG. 7 is a cross-sectional view of another partially assembled optical package in accordance with an embodiment of the invention.

FIG. 7 shows a cross-sectional view of a partial optical package 84 in accordance with another embodiment of the invention. The optical package 84 shown in FIG. 7 is substantially identical to the optical package 60 of FIG. 3 except that the second surface 44 of the transparent material 40 is facing the upper surface 34 of the image sensor 28 and the recess 48a is facing outwardly of the optical package 84.

Figure 8:
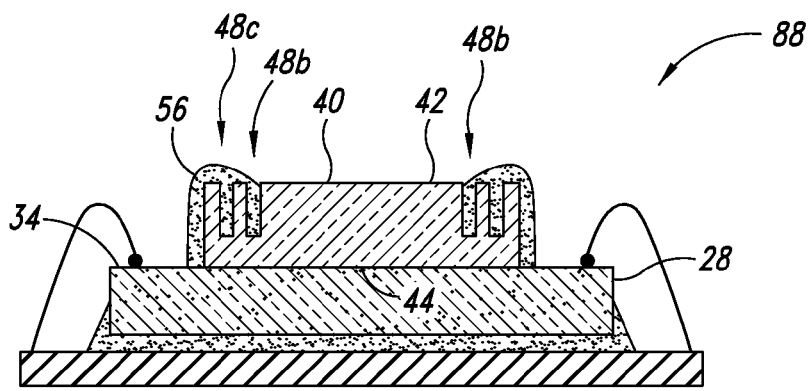
FIG. 8 is a cross-sectional view of another partially assembled optical package in accordance with an embodiment of the invention.

The optical package 88 shown in FIG. 8 is substantially identical to the optical package 70 of FIG. 5A except that the second surface 44 of the transparent material 40 is facing the upper surface 34 of the image sensor 28 and the plurality of recesses 48a are facing outwardly of the package.

Figure 9:
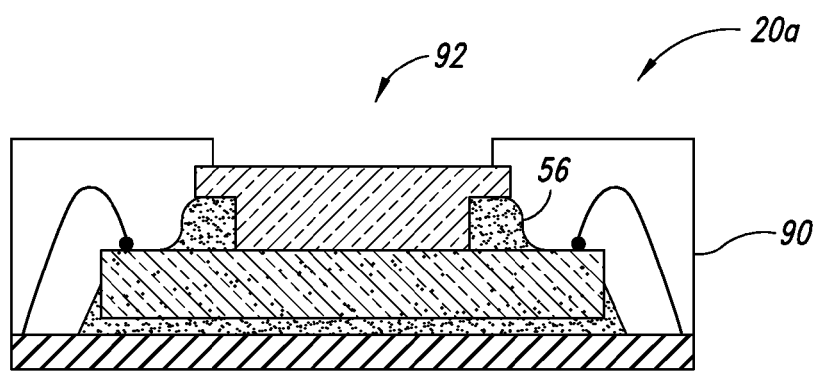
FIG. 9 is a cross-sectional view of a fully assembled optical package of FIG. 1 in accordance with an embodiment of the invention.

FIG. 9 shows a cross-sectional view of an optical package 20 of FIG. 1 fully assembled, referred to as optical package 20a, in accordance with another embodiment of the invention. In particular, the optical package 20a of FIG. 9 is substantially identical to the optical package 20 of FIG. 1 except that the optical package 20a of FIG. 9 further includes encapsulation material 90. The encapsulation material 90 is located over at least a portion of the inner surface 24 of the substrate 22 and surrounds the conductive wires 38 and exposed portions of the image sensor 28. The encapsulation material 90 further covers the adhesive material 56 and side surfaces of the transparent material 40, with a portion of the encapsulation material 90 being located on the second surface 44 of the transparent material 40. The encapsulation material 90 protects the internal components therein from environmental damage, such as physical damage, moisture damage, particles, corrosion and other contaminants.

The encapsulation material 90 has an aperture 92 above the transparent material 40 to allow radiation to be provided to the pixel array of the image sensor 28. The encapsulation material 90 may be formed by known methods, such as transfer molding. The shape of the encapsulation material 90 with the aperture 92 may be formed during the molding process. Alternatively, the encapsulation material 90 may be formed to cover the second surface 44 of the transparent material 40, after which a portion of the encapsulation material is removed from the second surface 44 of the transparent material 40 to form the aperture 92. For instance, the portion of the encapsulation material may be removed by laser.

Figure 10:
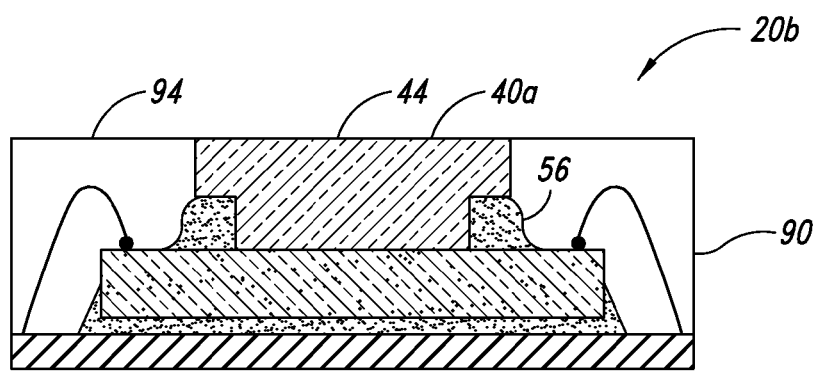
FIG. 10 is a cross-sectional view of a fully assembled optical package in accordance with another embodiment of the invention.

FIG. 10 shows a cross-sectional view of a fully assembled optical package 20 of FIG. 1, referred to as optical package 20b, in accordance with another embodiment of the invention. The optical package 20b of FIG. 10 is substantially identical to the optical package 20a of FIG. 9 except that the second surface 44 of the transparent material 40a is substantially planar with an outer surface 94 of the encapsulation material 90. In the illustrated embodiment, the transparent material 40a in the optical package 20b of FIG. 10 is thicker than the transparent material 40 of the optical package of FIG. 9. The optical package 20b may be formed by compress molding as is well known in the art.

Figure 11:
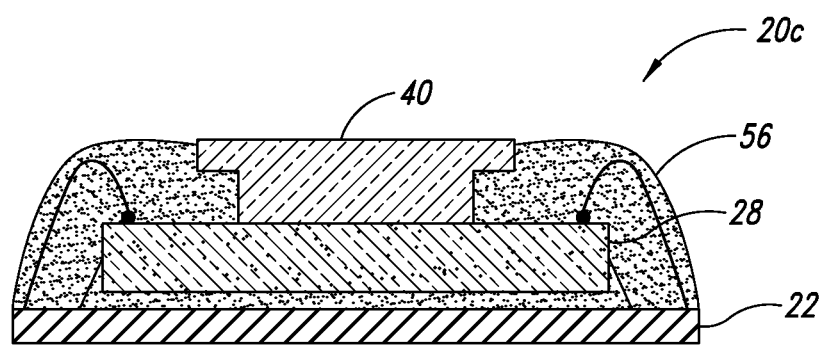
FIG. 11 is another fully assembled optical package in accordance with another embodiment of the invention.

It is to be appreciated that in any of the embodiments described above, the adhesive material 56 may flow over the conductive wires 38 and the bond pads of the image sensor 28. In fact, FIG. 11 shows a cross-sectional view of a fully assembled optical package of FIG. 1, in which the adhesive material 56 is used to protect the internal components from environmental damage. The optical package 20c of FIG. 11 is substantially identical to the optical package 20b of FIG. 10 except that the optical package 20c of FIG. 11 is covered by the adhesive material 56 rather than by encapsulation material. The adhesive material 56 performs substantially the same function, protecting internal components from environmental damage, as the encapsulation material.

In one embodiment, the transparent material 40 is secured to the upper surface 34 of the image sensor 28 as described above in reference to FIGS. 2A and 2B. Subsequently, further adhesive material 56 may be applied to surround the conductive wires 38, inner surface 24 of the substrate 22, and exposed surfaces of the image sensor 28. It is to be appreciated that the embodiment shown in FIG. 11 can be used with any of the various embodiments described herein.

The various optical packages disclosed herein may be used in various electrical devices, such as cameras, smart phones, video processing and any other electrical devices that may include an optical device or image sensor.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical package comprising:
a substrate;
an image sensor secured to the substrate, the image sensor having an upper surface and a pixel array at the upper surface;
a transparent material located over the pixel array and having a first surface and an opposite, second surface, the first surface having a recess located at a periphery portion of the transparent material, a center portion of the first surface abutting the upper surface of the image sensor;
conductive elements electrically coupling the pixel array to the substrate, each of the conductive elements having a first end coupled to the upper surface of the image sensor and a second end coupled to the substrate; and
an adhesive securing the transparent material to the upper surface of the image sensor, at least a portion of the adhesive located in the recess of the first surface of the transparent material, the conductive elements being positioned lateral to and spaced apart from the transparent material and the adhesive.

2. The optical package of claim 1 wherein the first surface of the transparent material faces the upper surface of the image sensor.

3. The optical package of claim 1 wherein the second surface of the transparent material faces the upper surface of the image sensor.

4. The optical package of claim 1 wherein the transparent material is glass.

5. The optical package of claim 1 wherein the recess extends to an edge of the transparent material and forms a bottom surface and a side surface.

6. The optical package of claim 1 wherein the recess extends around the entire periphery portion of the transparent material.

7. The optical package of claim 1 wherein the recess forms a channel at the periphery portion of the transparent material that includes a bottom surface separated by side surfaces.

8. The optical package of claim 7 wherein the first surface has a plurality of recesses located at the periphery portion of the transparent material.

9. The optical package of claim 8 wherein each of the plurality of recesses has different dimensions of the side surfaces.

10. A method of forming an optical package, the method comprising:
forming a recess in a first surface of a transparent material, the recess being located at a periphery portion of the transparent material;
providing adhesive between the recess in the first surface of the transparent material and a first surface of an image sensor that includes a pixel array;
using the adhesive to secure the first surface of the transparent material to the first surface of the image sensor, a portion of the adhesive located in the recess, a center portion of the first surface of the transparent material abutting the first surface of the image sensor; and
coupling a first end of a coupling element to the first surface of the image sensor and a second end of the coupling element to a substrate, wherein the coupling element is positioned lateral to and spaced apart from the transparent material and the adhesive.

11. The method of claim 10 wherein forming the recess in the first surface of the transparent material includes removing a portion of the first surface of the transparent material at a perimeter of the transparent material.

12. The method of claim 11 wherein removing the portion of the first surface of the transparent material at the perimeter of the transparent material comprises using a saw blade, cutting into the first surface of the transparent material to a distance that is less than an entire thickness of the transparent material.

13. The method of claim 10 wherein forming the recess in the first surface of the transparent material comprises forming a channel in the first surface of the transparent material at the periphery portion of the transparent material that includes a bottom surface separated by side surfaces.

14. The method of claim 13 wherein forming the recess in the first surface of the transparent material comprises forming a plurality of channels in the first surface of the transparent material at the periphery portion of the transparent material.

15. The method of claim 10 wherein providing adhesive between the recess in the first surface of the transparent material and the first surface of the image sensor comprises depositing the adhesive on a portion of the first surface of the image sensor.

16. The method of claim 10, wherein coupling the first end of the coupling element to the image sensor and the second end of the coupling element to the substrate is performed before providing adhesive between the recess in the first surface of the transparent material and the first surface of the image sensor.

17. An optical package comprising:
a substrate;
an image sensor secured to the substrate, the image sensor having an upper surface and a pixel array at the upper surface, the upper surface having a first dimension;
a transparent material located over the pixel array and having a first surface and an opposite, second surface that is closer to the upper surface of the image sensor than the first surface, the first surface having a recess located at a periphery of the transparent material; and
an adhesive located in the recess and securing the second surface of the transparent material to the upper surface of the image sensor, the second surface of the transparent material having a second dimension that is smaller than the first dimension such that a portion of the upper surface of the image sensor is exposed.

18. The optical package of claim 17 wherein the recess is one of a plurality of recess, the adhesive located in the plurality of recesses.

19. The optical package of claim 17 wherein the recess extends to an edge of the transparent material and forms a bottom surface and a side surface.

20. The optical package of claim 1 wherein the conductive elements have portions that are along sides surfaces of the transparent cover.

21. The optical package of claim 1 further comprising encapsulation material surrounding the conductive elements and along the side surfaces of the image sensor.

22. The optical package of claim 1 wherein the conductive elements includes first and second conductive elements that are positioned laterally from the transparent material, the transparent material and the adhesive being positioned the first and the second conductive elements.

23. The optical package of claim 17, wherein the second surface of the transparent material abuts the upper surface of the image sensor.

24. The optical package of claim 17, wherein the recess is positioned between a center of the transparent material and a sidewall of the transparent material, the recess being spaced from the sidewall of the transparent material.

25. The optical package of claim 1 wherein the upper surface of the image sensor has a first dimension, the first surface of the transparent material having a second dimension that is smaller than the first dimension such that a portion of the upper surface of the image sensor is exposed.

* * * * *